United States Patent
Haag et al.

(10) Patent No.: US 10,718,818 B2
(45) Date of Patent: *Jul. 21, 2020

(54) ANALYZING AND CONTROLLING PERFORMANCE IN A COMPOSITE BATTERY MODULE

(71) Applicant: International Business Machines Corporation, Armonk, NY (US)

(72) Inventors: Michael Haag, Rodenbach (DE); Rainer K. Krause, Kostheim (DE); Thorsten Muehge, Budenheim (DE); Joerg Weyerhaeuser, Grolsheim (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 106 days.

This patent is subject to a terminal disclaimer.

(21) Appl. No.: 15/785,471

(22) Filed: Oct. 17, 2017

(65) Prior Publication Data
US 2018/0038916 A1 Feb. 8, 2018

Related U.S. Application Data

(63) Continuation of application No. 13/270,614, filed on Oct. 11, 2011, now Pat. No. 9,851,412.

(30) Foreign Application Priority Data

Nov. 9, 2010 (EP) ..................................... 10190507

(51) Int. Cl.
*G01R 31/396* (2019.01)
*G01R 31/3842* (2019.01)
(Continued)

(52) U.S. Cl.
CPC .......... *G01R 31/396* (2019.01); *B60L 3/0046* (2013.01); *B60L 58/12* (2019.02);
(Continued)

(58) Field of Classification Search
CPC .............. B60L 11/1857; B60L 11/1861; B60L 11/1866; B60L 58/22; B60L 58/12;
(Continued)

(56) References Cited

U.S. PATENT DOCUMENTS

| | | | |
|---|---|---|---|
| 5,204,610 A * | 4/1993 | Pierson | .................... H02J 9/061 307/66 |
| 5,432,452 A | 7/1995 | Fiorina et al. | |

(Continued)

FOREIGN PATENT DOCUMENTS

JP 2009089453 A 4/2009

OTHER PUBLICATIONS

Xiao et al. "A Universal State-of-Charge Algortihm for Batteries," DAC'10, Jun. 13-18, 2010, 6 pages.

*Primary Examiner* — Catherine T. Rastovski
(74) *Attorney, Agent, or Firm* — Cantor Colburn LLP; Anthony V England

(57) ABSTRACT

A method for performance analysis and use management of a battery module is disclosed, wherein the battery module includes a multitude of interconnected battery cells and a battery management system with a plurality of dedicated analysis/control units (ACUs) that analyze performance of the battery module, the ACUs being assigned to individual battery cells and/or battery blocks of battery module. The method includes measuring current and voltage of one or more of an individual battery cell and a battery block; calculating a charge removal from the one or more of the individual battery cell and the battery block; calculating a loading charge of the one or more of the individual battery (Continued)

cell and the battery block; determining the remaining charge of the one or more of the individual battery cell and the battery block; and failure monitoring of the one or more of the individual battery cell and the battery block.

19 Claims, 5 Drawing Sheets

(51) Int. Cl.
- B60L 3/00 (2019.01)
- H01M 10/42 (2006.01)
- H01M 10/48 (2006.01)
- B60L 58/12 (2019.01)
- B60L 58/22 (2019.01)
- B60L 58/16 (2019.01)
- H01M 10/04 (2006.01)

(52) U.S. Cl.
CPC .............. *B60L 58/16* (2019.02); *B60L 58/22* (2019.02); *G01R 31/3842* (2019.01); *H01M 10/425* (2013.01); *H01M 10/482* (2013.01); *H01M 10/486* (2013.01); *B60L 2240/545* (2013.01); *B60L 2240/547* (2013.01); *B60L 2240/549* (2013.01); *B60L 2260/44* (2013.01); *B60L 2260/50* (2013.01); *B60L 2260/52* (2013.01); *H01M 10/0445* (2013.01); *H01M 2010/4271* (2013.01); *H01M 2010/4278* (2013.01); *Y02T 10/7005* (2013.01); *Y02T 10/7044* (2013.01); *Y02T 10/7061* (2013.01)

(58) Field of Classification Search
CPC .............. B60L 58/16; B60L 2240/545; B60L 2240/547; B60L 2240/549; B60L 2260/44; B60L 2260/50; B60L 2260/52; G01R 31/3624; G01R 31/3658; G01R 31/396; G01R 31/3842; H01M 10/482; H01M 10/486; H01M 10/425; H01M 10/0445; H01M 2010/4271; H01M 2010/4278; Y02T 10/7044; Y02T 10/7061
See application file for complete search history.

(56) References Cited

U.S. PATENT DOCUMENTS

| | | | |
|---|---|---|---|
| 5,787,128 A | 7/1998 | Honkisz | |
| 5,811,959 A | 9/1998 | Kejha | |
| 5,923,148 A | 7/1999 | Sideris et al. | |
| 6,204,636 B1 | 3/2001 | Kinoshita et al. | |
| 6,453,249 B1 | 9/2002 | Shibutani et al. | |
| 6,456,042 B1 | 9/2002 | Kwok | |
| 6,526,361 B1 | 2/2003 | Jones et al. | |
| 6,969,566 B2* | 11/2005 | Matsui | H01M 10/4257 320/106 |
| 6,983,212 B2* | 1/2006 | Burns | H02J 7/0019 320/106 |
| 7,061,246 B2 | 6/2006 | Dougherty et al. | |
| 7,081,737 B2 | 7/2006 | Liu et al. | |
| 7,514,905 B2 | 4/2009 | Kawahara et al. | |
| 7,515,444 B2 | 4/2009 | Chen | |
| 7,535,199 B2 | 5/2009 | Kimura et al. | |
| 7,557,586 B1 | 7/2009 | Vonderhaar et al. | |
| 7,576,545 B2 | 8/2009 | Singh et al. | |
| 7,619,417 B2 | 11/2009 | Klang | |
| 7,634,369 B2 | 12/2009 | Lim et al. | |
| 7,638,974 B2 | 12/2009 | Maleus | |
| 7,656,124 B2 | 2/2010 | Seo et al. | |
| 7,705,491 B2* | 4/2010 | King | B60L 3/0046 307/80 |
| 7,728,552 B2 | 6/2010 | Burns | |
| 7,728,555 B2 | 6/2010 | Seo et al. | |
| 7,821,232 B2 | 10/2010 | Shun-Hsing | |
| 8,076,905 B2 | 12/2011 | Ko et al. | |
| 8,078,416 B2 | 12/2011 | Iwane | |
| 8,232,774 B2 | 7/2012 | Matsumura et al. | |
| 8,350,529 B2 | 1/2013 | Loncarevic | |
| 8,407,018 B2 | 3/2013 | White et al. | |
| 8,450,973 B2 | 5/2013 | Ho | |
| 8,471,529 B2 | 6/2013 | Vance et al. | |
| 2003/0113599 A1 | 6/2003 | Pearson | |
| 2006/0012334 A1 | 1/2006 | Watson | |
| 2007/0120536 A1 | 5/2007 | Runkle et al. | |
| 2008/0012534 A1 | 1/2008 | Bucur | |
| 2008/0048662 A1 | 2/2008 | Hirsch et al. | |
| 2008/0088279 A1 | 4/2008 | Lim et al. | |
| 2008/0129522 A1 | 6/2008 | Densham et al. | |
| 2008/0136367 A1* | 6/2008 | Adest | H02J 7/0063 320/103 |
| 2008/0150489 A1 | 6/2008 | Shun-Hsing | |
| 2008/0278115 A1 | 11/2008 | Huggins et al. | |
| 2009/0027056 A1 | 1/2009 | Huang et al. | |
| 2009/0030626 A1 | 1/2009 | Iwane et al. | |
| 2009/0115419 A1 | 5/2009 | Ueda et al. | |
| 2009/0140870 A1 | 6/2009 | Densham | |
| 2009/0146610 A1 | 6/2009 | Trigiani | |
| 2009/0174369 A1 | 7/2009 | Kawahara et al. | |
| 2009/0210736 A1 | 8/2009 | Goff et al. | |
| 2009/0218987 A1 | 9/2009 | Tominaga et al. | |
| 2010/0013429 A1 | 1/2010 | Chiang et al. | |
| 2010/0019724 A1 | 1/2010 | Mizutani et al. | |
| 2010/0019732 A1 | 1/2010 | Utsumi et al. | |
| 2010/0026243 A1 | 2/2010 | Tatsumi | |
| 2010/0039071 A1 | 2/2010 | Hansford et al. | |
| 2010/0052614 A1 | 3/2010 | Mariels et al. | |
| 2010/0121591 A1 | 5/2010 | Hall | |
| 2010/0194339 A1* | 8/2010 | Yang | H02J 7/0016 320/116 |
| 2010/0196748 A1 | 8/2010 | Ellwanger | |
| 2010/0217552 A1 | 8/2010 | Hsu et al. | |
| 2010/0231166 A1 | 9/2010 | Lee et al. | |
| 2011/0006727 A1 | 1/2011 | Blau et al. | |
| 2011/0015881 A1 | 1/2011 | Chen et al. | |
| 2011/0193527 A1 | 8/2011 | Ho | |
| 2011/0248677 A1 | 10/2011 | Shimizu | |
| 2011/0270546 A1 | 11/2011 | Smith | |
| 2012/0004873 A1 | 1/2012 | Li | |
| 2012/0043814 A1 | 2/2012 | Deligianni et al. | |
| 2012/0074898 A1 | 3/2012 | Schwartz | |
| 2012/0112685 A1* | 5/2012 | Hartley | B60L 3/0038 320/106 |
| 2012/0116701 A1* | 5/2012 | Yuasa | H01M 10/44 702/63 |
| 2012/0187907 A1 | 7/2012 | Nysen | |
| 2012/0223584 A1 | 9/2012 | Ledenev | |
| 2012/0262110 A1 | 10/2012 | Soong et al. | |
| 2012/0319657 A1 | 12/2012 | Ke et al. | |
| 2012/0319695 A1 | 12/2012 | Yano et al. | |
| 2013/0018606 A1* | 1/2013 | White | H01M 10/441 702/58 |
| 2013/0057198 A1 | 3/2013 | Gerlovin | |

\* cited by examiner

ANALYZING AND CONTROLLING PERFORMANCE IN A COMPOSITE BATTERY MODULE

DOMESTIC AND FOREIGN PRIORITY

This application is a continuation of U.S. patent application U.S. Ser. No. 13/270,614 filed Oct. 11, 2011 which claims priority to European Patent Application No. 10190507.3, filed 9 Nov. 2010, and all the benefits accruing therefrom under 35 U.S.C. § 119, the contents of which in its entirety are herein incorporated by reference.

BACKGROUND

The invention relates generally to composite batteries, especially batteries for electric vehicles, in which a multitude of battery cells are electrically interconnected. Specifically, the invention relates to monitoring and controlling individual battery cells within a composite battery comprising a multitude of battery cells by using analysis/control units on cell or block level for diagnosing and/or controlling the module's performance.

In electric vehicles, battery modules are a key enabler for driving performance and reliability. These battery modules are typically made up of a set of electrically interconnected battery cells, e.g., of to Li-ion type. In order to ensure efficient use of such battery modules, their components, particularly their cells, must be analyzed in detail and over time. Thus, the battery modules must be provided with diagnostic features which permit identification of underperformance or malfunction of battery cells within the modules without the need of disconnecting or disassembling them. These features should include anticipatory features which permit to assess not only the actual battery capacity, but also prospective behavior of the battery module.

Numerous battery monitoring systems exploiting a wide variety of battery parameters are known from the state of the art:

For example, U.S. Pat. No. 7,619,417 B2 describes a battery monitoring system which utilizes a minimum amount of input data (including voltage, current, temperature and conductance) to periodically determine vehicle battery status.

U.S. Pat. No. 7,576,545 B2 discloses systems and methods for predicting end of life of a Li-ion battery. Among others, a method is described which makes use of partially charging/discharging the battery, measuring an open circuit voltage of the battery before/after a partial charging/discharging and determining a state of charge value of the battery corresponding to the open circuit voltage measured before and after partial charging/discharging.

Further detection devices and methods for analyzing and monitoring the state of vehicle batteries are described in US 2009/0115419 A, US 2009/0027056 A1, US 2008/0048662 A1, U.S. Pat. No. 7,061,246 B2, U.S. Pat. No. 7,514,905 B2 and US 2009/0174369 A1. These methods are based on measurements of various battery parameters such as battery voltage, discharge current from the battery, internal resistance, etc. For example, US 2008/0048662 A1 suggests using the battery's impedance which may be obtained from measurements of voltage and current frequency components. U.S. Pat. No. 7,061,246 B2 describes a method for estimating battery lifetime by determining a representative parameter (which may be based, for example, on voltage and temperature) in a new, fully charged state and monitoring this parameter during use of the battery. U.S. Pat. No. 7,514,905 B2 and US 2009/0174369 A1 disclose battery management systems which use temperature, voltage and current to determine the battery state and enable optimum charge and discharge control. The temperature is measured in various locations within the battery, and respective values of maximum available charge/discharge powers or maximum available charge/discharge currents of the battery are determined for the minimum and maximum temperature.

A rechargeable battery with internal microcontroller is disclosed in US 2010/0039071 A1. This microcontroller stores data regarding the environment to which the battery is exposed and conveys these data to a charger used to charge the battery. If the data indicate that the battery may have been subjected to a harsh environment, the charger performs a full state of health evaluation of the battery.

US 2009/0210736 A1 discloses a computer system which gathers information relating to the operational state of a battery, calculates the health of the battery from the gathered information, provides the health and the operational state of the battery to a vehicle operator and includes means for supporting non-battery related functions.

U.S. Pat. No. 7,557,586 B1 describes an electronic battery tester for testing a battery pack comprising a plurality of batteries. The tester comprises a circuitry for measuring dynamic parameters of the battery pack, a memory for storing a multitude of known configurations (serial, parallel and series-parallel) of the batteries in the pack and a microprocessor for identifying the configuration and adjusting test criteria.

An on-line battery monitoring system for monitoring a plurality of battery cells is shown in U.S. Pat. No. 5,923,148 A. This system is capable of identifying and computing individual cell and battery bank parameters. The system comprises a controller for designating a given battery cell to be monitored, a multiplexer responsive to designation by the controller, an analog board for receiving electrical signals from a given battery cell and a control board for selectively initiating a load test, battery bank charging or voltage measurement.

While the battery monitoring system described in U.S. Pat. No. 5,923,148 A is capable of collecting and analyzing data from a plurality of battery cells within a battery bank, it is generally geared at testing batteries in industrial plants. Its applicability to battery modules in electric drive systems for vehicles is therefore limited. In particular, U.S. Pat. No. 5,923,148 A contains no information on how parameters obtained from the single cell measurements may be used for assessing and controlling the performance of the overall battery block.

SUMMARY

In one embodiment, a method for performance analysis and use management of a battery module is disclosed, wherein the battery module includes a multitude of interconnected battery cells and a battery management system with a plurality of dedicated analysis/control units (ACUs) that analyze performance of the battery module, the ACUs being assigned to individual battery cells and/or battery blocks of battery module. The method includes measuring current and voltage of one or more of an individual battery cell and a battery block; calculating a charge removal from the one or more of the individual battery cell and the battery block; calculating a loading charge of the one or more of the individual battery cell and the battery block; determining the remaining charge of the one or more of the individual battery cell and the battery block; and failure monitoring of the one or more of the individual battery cell and the battery block.

In another embodiment, a battery module includes a plurality of interconnected battery cells and a battery management system with a plurality of dedicated analysis/control units (ACUs) including ACU chips that analyze performance of one or more of an individual battery cell and a battery block. Each ACU chip includes at least one sensor configured to measure voltage and one sensor configured to measure current of an associated one or more of the individual battery cell and the battery block; and a switch configured to remove the one or more of the individual battery cell and the battery block from the battery module network if the one or more of the individual battery cell and the battery block is found to have reached a predefined level of degradation.

In another embodiment, a non-transitory, computer readable medium having computer readable instructions stored thereon that, when executed by a computer, implement a method for performance analysis and use management of a battery module, wherein the battery module comprises a multitude of interconnected battery cells and a battery management system with a plurality of dedicated analysis/control units (ACUs) that analyze performance of the battery module, the ACUs being assigned to individual battery cells and/or battery blocks of battery module. The method includes measuring current and voltage of one or more of an individual battery cell and a battery block; calculating a charge removal from the one or more of the individual battery cell and the battery block; calculating a loading charge of the one or more of the individual battery cell and the battery block; determining the remaining charge of the one or more of the individual battery cell and the battery block; and performing failure monitoring of the one or more of the individual battery cell and the battery block.

BRIEF DESCRIPTION OF THE DRAWINGS

The present invention embodiments may best be understood from the following detailed description, but not restricted to the embodiments, in which:

FIG. 3a is a schematic circuit diagram of ACU chip of FIG. 2a;

Figure 1:
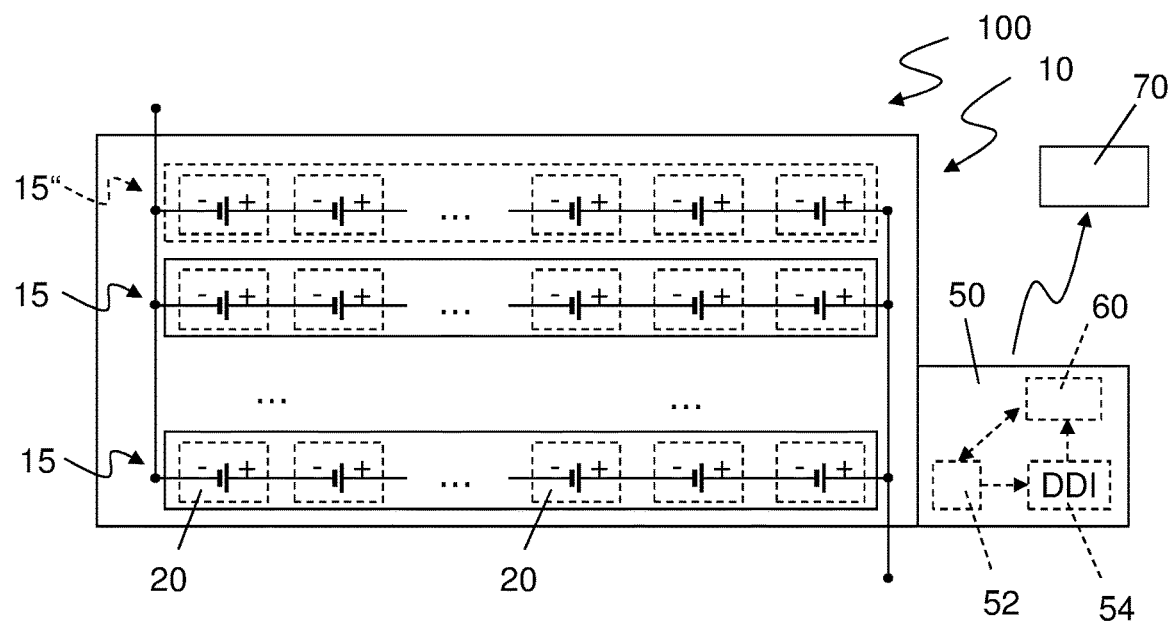
FIG. 1 is a schematic circuit diagram of a battery module with a multitude of electrically interconnected battery cells.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION

While the above described patents disclose various methods for battery analysis and monitoring based on a variety of parameters of the battery, they do not provide a detailed analysis of the actual state of individual battery cells within a battery module. In order to obtain a detailed picture of the actual battery state, however, it is desirable to be able to test and evaluate battery module capability with a high granularity, i.e., down to cell level.

There is also a need for a battery management system with real time and online feedback capability for reporting the actual state of individual battery cells as well as of the battery module as a whole. Moreover, it is desirable to integrate additional features such as an ability to quickly react in case of the failure or malfunction of individual battery cells within the battery module by automatically initiating maintenance actions if a given cell has reached a predefined level of degradation. This is of especially high importance if the battery module is to be used in a vehicle drive system.

FIG. 1 shows a schematic view of a battery module 10 to be used in a drive system of an electric vehicle. The battery module 10 comprises a multitude of electrically interconnected electrochemical battery cells 20, for example, Li-ion cells. Each of the battery cells 20 is capable of storing chemical energy and converting it into electrical energy. The cells 20 are rechargeable in the sense that they may be charged/discharged multiple times. The cells 20 may be connected in series to achieve a desired output voltage and/or in parallel to provide a desired amount of current source capability. Battery cells 20 within module 10 may be grouped into blocks 15. In the embodiment of FIG. 1, cells 20 are connected in serial arrays to form blocks (strings) 15 which are in turn connected in parallel to form battery module 10.

Figure 2A:
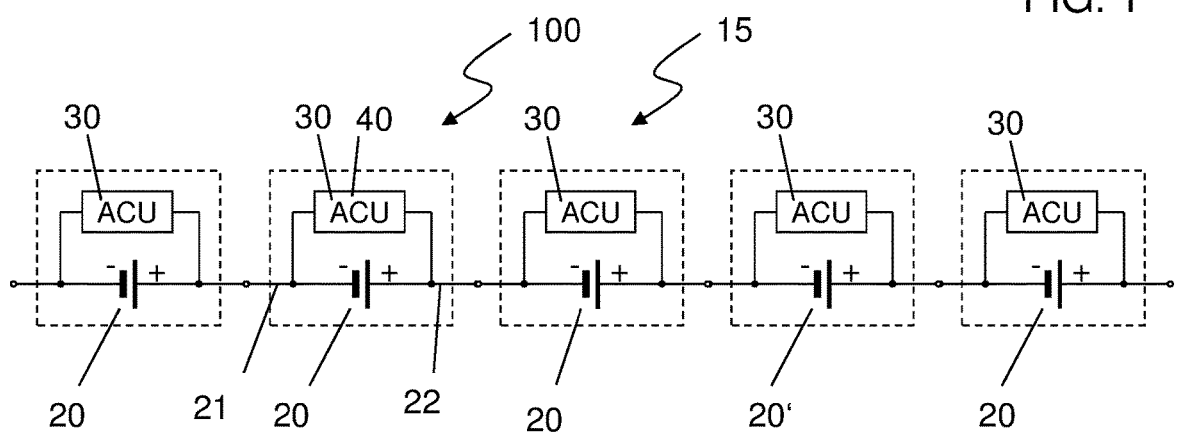
FIG. 2a is a schematic circuit diagram of a plurality of battery cells arranged in a serial array, each battery cell being equipped with an analysis/control unit (ACU)

Battery module 10 comprises a battery management system 100 with a multitude of analysis and control units (ACUs) 30 which are placed in various locations within battery module 10 and are integrated into the electrical network of battery module 10. As an example, FIG. 2a shows a detailed circuit diagram of a part of battery module 10 comprising a string 15 of battery cells 20 which are connected in serial array. Each battery cell 20 is provided with a dedicated analysis/control unit (ACU) 30 which is connected in parallel with this particular battery cell 20. Using ACU 30, selected operating parameters of associated battery cell 20 may be monitored during operational mode as well as in charge mode. Moreover, ACU 30 comprises capabilities enabling it to execute control functions on associated battery cell 20.

Figure 3A:
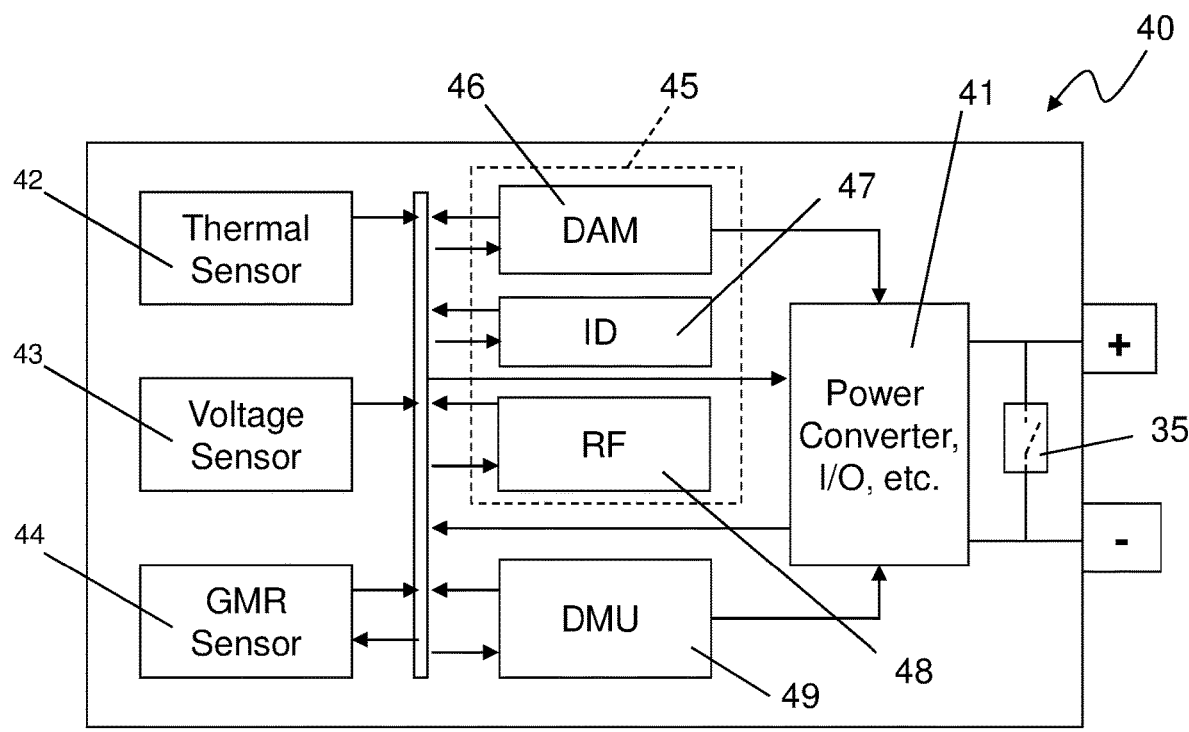

FIG. 3a depicts a schematic layout of an ASIC embodiment 40 of ACU 30 with sub-circuits (function blocks) for identification, measurement and transmission. ACU chip 40 is connected to ground pin 21 and to positive terminal pin 22 of battery cell 20. ACU chip 40 contains a variety of sensors such as a thermal sensor 42, a voltage sensor 43 and a magnetic field sensor 44 the data of which may be used for inferring cell current.

Figure 3B:
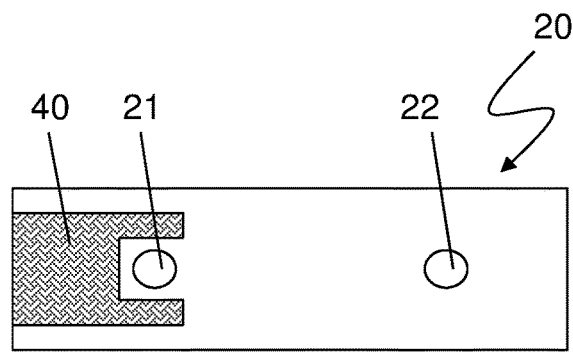
FIG. 3b is a schematic sectional view of a battery cell with the associated ACU chip.

Magnetic field sensor 44 may be a GMR (giant magnetic resonance) sensor and is used for carrying out current measurements via a magnetic field (Hall effect) measurement on the respective battery cell 20: According to Ampere's law, an electric current I flowing through a wire (such as electrical contact pins 21, 22 of battery cell 20) produces a magnetic field B. The path integral of the magnetic field B along a closed curve C surrounding this wire is proportional to the current $I_{enc}$ flowing through the wire:

$$\oint_C \vec{B}d\vec{l} = \mu_0 I_{enc},$$

where $\mu_0$ is the magnetic constant. Thus, by placing ACU chip 40 in close vicinity of power pins 21 or 22 of battery cell 20, current through this cell may be measured. Measurement accuracy may be enhanced by dimensioning ACU chip 40 in such a way that magnetic field sensor 44 may be positioned immediately adjacent to one of the contact pins 21 and encircles this power pin 21 (at least partly). This is depicted schematically in FIG. 3b which shows a schematic sectional view of battery cell 20 with the associated ACU chip 40 partly enclosing power pin 21.

Besides sensors 42, 43, 44, ACU chip 40 comprises a transmission circuit 46 for transmitting data acquired by the sensors 42, 43, 44 to a collector unit 50 of battery module 10 (see FIG. 1). Transmission circuit 45 comprises a modulator 46 which transforms output signals issued by the sensors 42, 43, 44 into an appropriate format for physical transmission to a demodulator 52 located in collector unit 50 which collects signals issued from various battery cells 20 contained in battery module 10. An identification circuit 47 attaches a unique digital identification number which allows signals sent to collector unit 50 to be tracked back to the specific battery cell 20 they originate from. Transmission circuit 45 may comprise an RF (radio frequency) unit 48 for enabling wireless communication between ACU chip 40 of battery cell 20 and collector unit 50 of battery module 10.

A data management unit (DMU) 49 comprises means for controlling data transfer from sensors 42, 43, 44 to transmission circuit 45. Data management unit 49 may also comprise additional features such as a logical unit to be used for diagnostics and (pre-) evaluation of the sensor signals and/or memory for storing measured data, historical data, threshold/reference data and/or software for performing diagnostics. In order to allow signals from multiple sensors 42, 43, 44 to be transmitted to collector unit 50 in an orderly fashion, data management unit 49 contains a multiplexer which is used to switch between the signals issued by the various sensors 42, 43, 44 of ACU chip 40.

ACU chip 40 may also include hardware features such as bypass diodes and/or switches 35, which may, for example, be used to short-circuit battery cell 20 in the case that measured power and/or temperature data acquired by sensors 42, 43, 44 attached to battery cell 20 exceed or fall below a pre-determined threshold value, indicating that battery cell 20 may be degraded or defective. If any battery cell 20 within battery module 10 fails, this has an impact on the module's performance. If, for example, a battery cell 20' in a serial array with other battery cells 20 (such as the one depicted in FIG. 2a) fails, this defective cell 20' acts as a current trap and causes the current through string 15 to sag. If this occurs, it is desirable to short-circuit defective battery cell 20' so that while the total voltage of the overall string 15 will be reduced by the voltage of the defective cell 20', the overall current will not diminish. As described above, ACU chip 40 may comprise means (e.g., diodes and/or switches 35) to short-circuit its respective battery cell 20 temporarily or permanently. Switch 35 may, for example, be embodied as a power MOSFET.

Note that in the embodiment of FIG. 3a, no additional wiring (besides wires connecting ACU chip 40 to battery cell 20) is required for communicating measurement data collected by sensors 42, 43, 44 to collector unit 50, since ACU chip 40 uses an RF unit 48 for wireless transmission of cell performance information to the collector unit 50 on module level. Power line communication is possible as well, using the DC lines with encoded signals dedicated to the unique cell. In order to allow ACUs 30 belonging to different battery cells 20, 20' within battery module 10 to use the same RF channel, a time domain multiple access (TDMA) scheme may be used for data transmission. All output signals originating from any specific battery cell 20' are coded using identification circuit 47 so as to individually identify the ACU 30' (and the battery cell 20') from which they were issued. Thus, all transmitted measured data and information about cell performance can be tracked back to a specific ACU chip 40' and to the specific battery cell 20' it is attached to.

Collector unit 50 of battery module 10 comprises a data acquisition and RF (de)modulating device 52 connected to a demodulation and data acquisition interface (DDI) 54. Besides data acquisition and demodulation, collector unit 50 may contain a multitude of additional functions such as temperature and voltage sensors, a multiplexer for switching between inputs from the various battery cells 20, 20', storage for storing historical data furnished by the various ACUs 30, a CPU for data (pre-)evaluation etc. In particular, collector unit 50 may comprise a control system 60 for triggering measurements and/or activating switches in selected ACU chips. For example, collector unit 50 is embodied as an ASIC chip which is physically identical to ACU units 40 of the individual battery cells 20, so that only one single type of ASIC is required.

Battery management system 100 as shown in FIGS. 2a and 3a allows real time battery performance analysis and control with a very high granularity, i.e., down to cell level. ACUs 30 of battery cells 20 furnish online data on the actual state of relevant operational parameters within the respective cell 20. By collecting and evaluating measurements of these parameters over a period of time, historical data of these parameters may be acquired which enable predictions of future performance of this specific battery cell 20. Moreover, individual battery cells 20 can be controlled independently (by switch 35). Performance prediction as well as the ability to eliminate failing individual cells 20 from the battery network enables a highly efficient management and optimized performance of battery module 10. In addition, it is possible to add spare individual cells to the battery network, thus enabling a high efficiency and high power availability.

Figure 5:
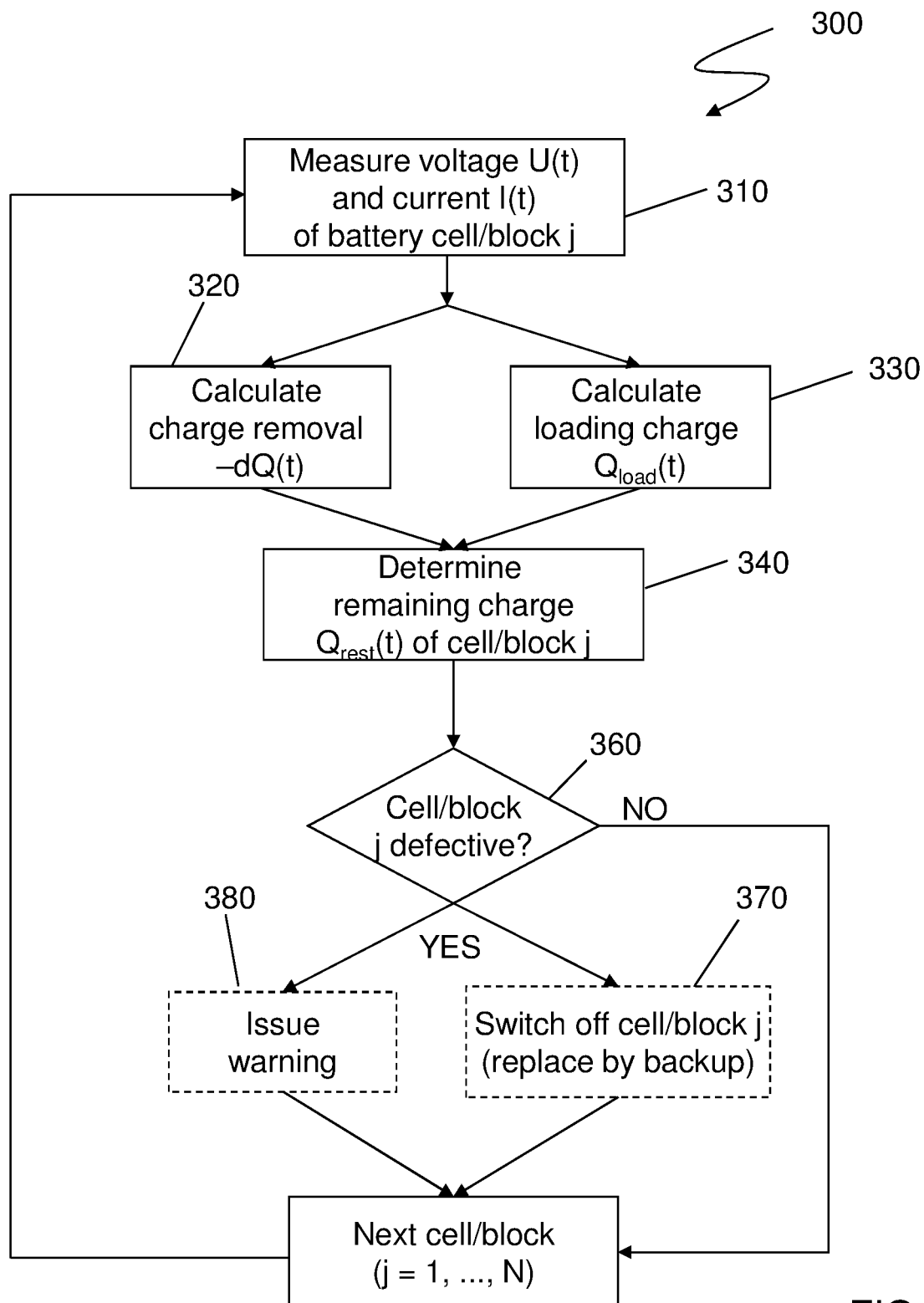
FIG. 5 is a schematic flow diagram of an exemplary embodiment of a method for analyzing and controlling the performance of a battery module.

FIG. 5 shows a schematic flow diagram of an analysis/control method 300 which may be implemented using ACU chips 40 dedicated to battery cells 20. Due to sensors 43, 44, each ACU chip 40 is capable of measuring a current $I_{enc}$ flowing through power pin 21 of the respective battery cell 20 and of measuring the voltage U of this cell 20 (block 310), and thus computing the power P=U*I of this cell. In particular, power changes during battery charge and discharge can be monitored (blocks 320 and 330). From this, the actual charge status of each battery cell 20 may be inferred (block 340). The time dependence of the cell power, as well as the battery charge, are indicators of the actual performance and degradation of battery cell 20 and may be used to predict the long-term performance of this cell 20. In particular, history data on the discharge behavior and the changes of remnant charge over time are important indicators for degradation prediction.

Figure 4A:
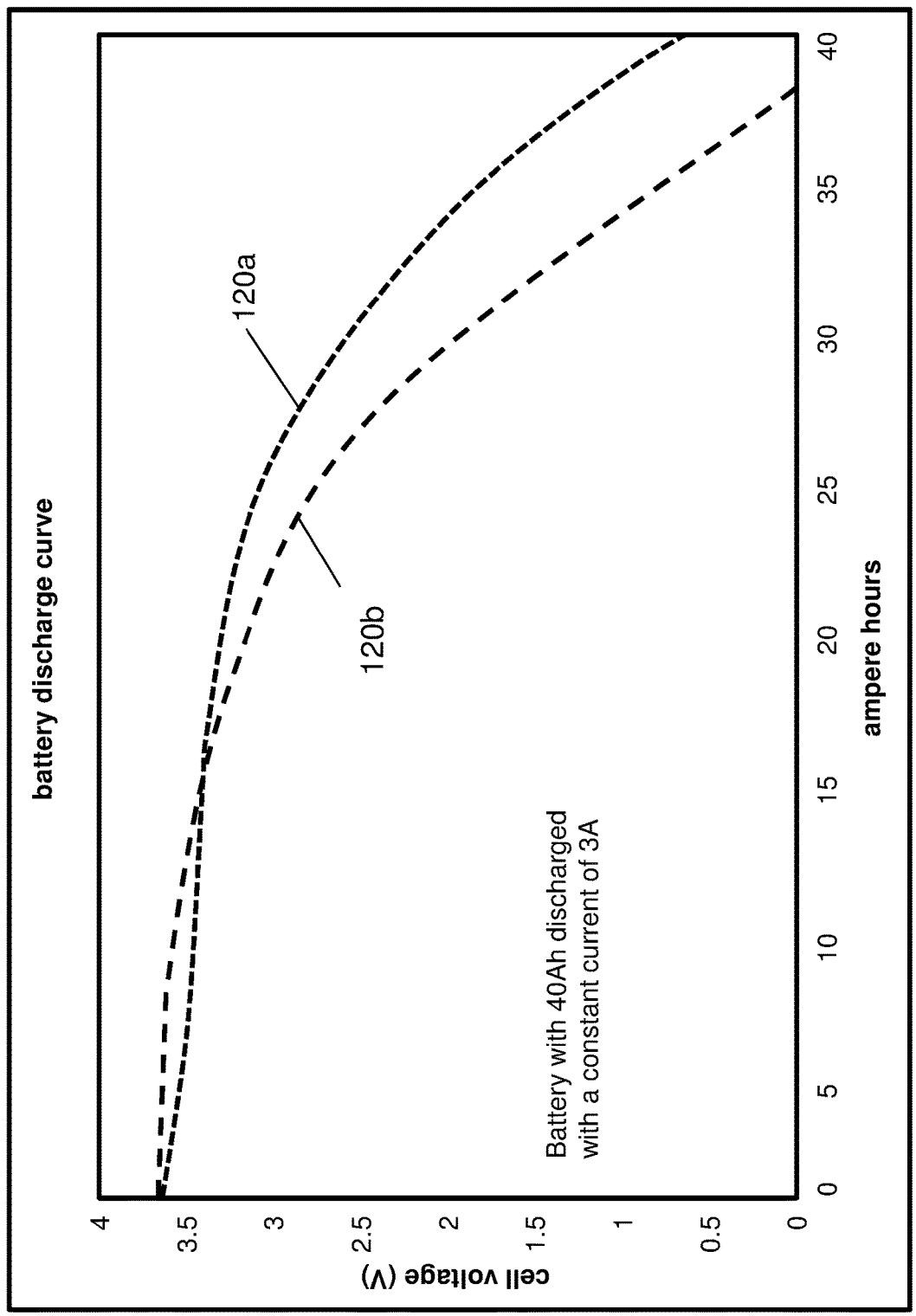
FIG. 4a is a diagram of cell voltage as a function of time for two selected battery cells.
Figure 4B:
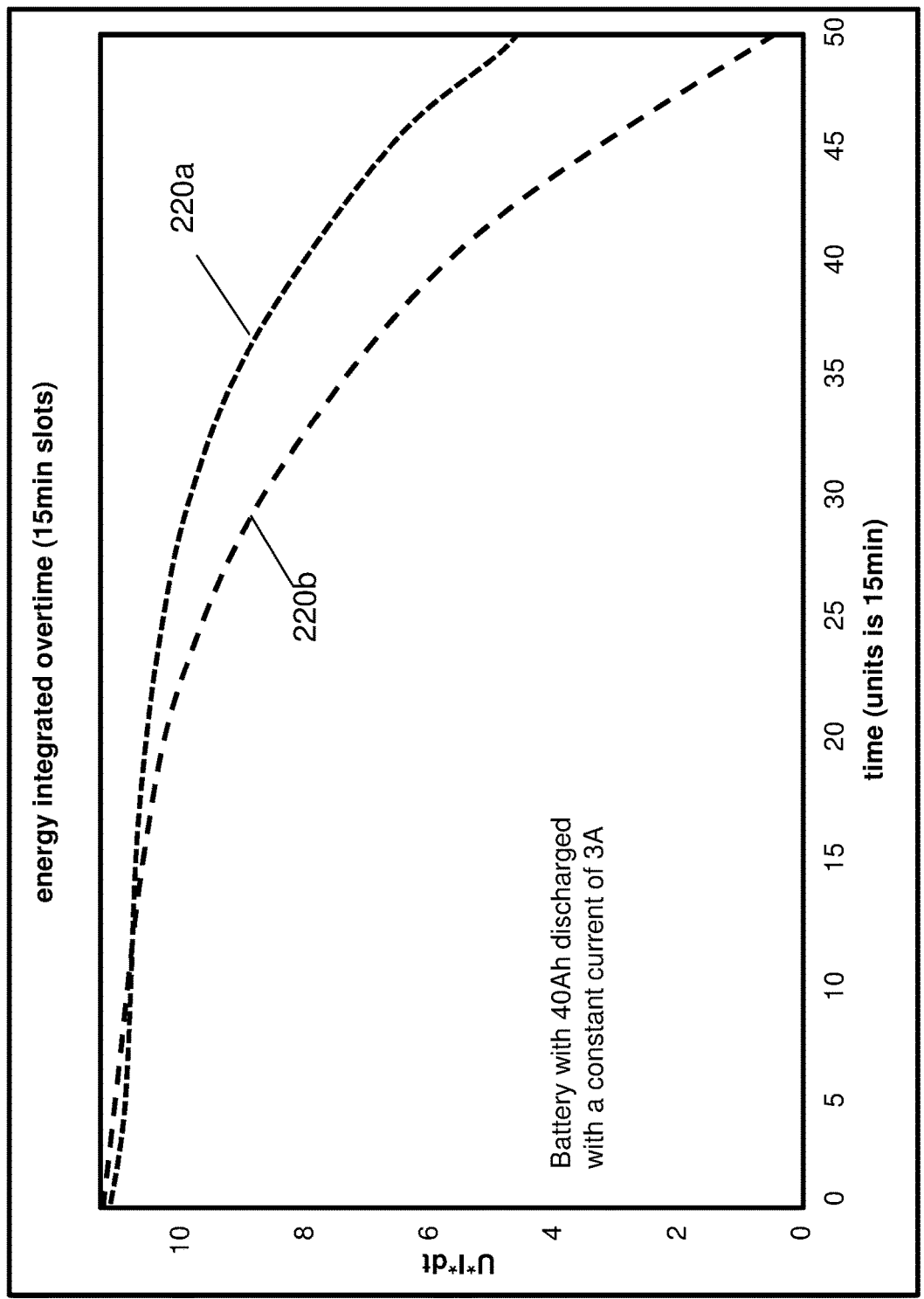
FIG. 4b is a diagram of cell energy as a function of time for two selected battery cells.

This is illustrated in FIG. 4a which shows a diagram of cell voltage as a function of time as measured for two battery cells 20a, 20b inside a 30 Ampere-hour battery module being discharged with a constant current of 3 Amperes. Curve 120a of cell voltage of battery cell 20a is seen to remain on a higher level for a longer time than curve 120b of cell 20b. FIG. 4b shows a diagram of cell energy as a function of time of the two battery cells 20a, 20b inside the 30 Ampere-hour battery module being discharged with a constant current of 3 Amperes. In this diagram, measured power U*I was integrated over time in intervals of 15 min, so that each data point corresponds to the energy delivered in a 15 minute time interval. As is seen from FIG. 4b, curve 220a of cell energy of battery cell 20a is seen to remain on a higher level for a longer time than curve 220b of cell 20b. Next to curves 120a/b, 220a/b corresponding to the measured data (solid lines), FIGS. 4a and 4b show curves (dotted lines) corresponding to polynomial fits of these data; these fits are seen to accurately reproduce the measured curves. Polynomial fits thus yield good estimates of the time behavior of both the remaining charge and the predicted life time of battery cells 20a, 20b. In particular, the slopes of the discharge curves (FIG. 4a) are a good indicator of battery lifetime, performance and cell degradation.

This is illustrated in FIG. 4a which shows a diagram of cell voltage as a function of time as measured for two battery cells 20, 20' inside a 30 Ampere-hour battery module being discharged with a constant current of 3 Amperes. Curve 120a of cell voltage of battery cell 20 is seen to remain on a higher level for a longer time than curve 120b of cell 20b. FIG. 4b shows a diagram of cell energy as a function of time of the two battery cells 20, 20' inside the 30 Ampere-hour battery module being discharged with a constant current of 3 Amperes. In this diagram, measured power U*I was integrated over time in intervals of 15 min, so that each data point corresponds to the energy delivered in a 15 minute time interval. As is seen from FIG. 4b, curve 220a of cell energy of battery cell 20 is seen to remain on a higher level for a longer time than curve 220b of cell 20'. Next to curves 120a/b, 220a/b corresponding to the measured data (solid lines), FIGS. 4a and 4b show curves (dotted lines) corresponding to polynomial fits of these data; these fits are seen to accurately reproduce the measured curves. Polynomial fits thus yield good estimates of the time behavior of both the remaining charge and the predicted life time of battery cells 20, 20'. In particular, the slopes of the discharge curves (FIG. 4a) are a good indicator of battery lifetime, performance and cell degradation.

ACU 30 thus furnishes a variety of information which can be used for a battery availability test in order to monitor the actual status of the battery, performance history and prediction, detection of weak performers, lifetime forecast, etc., down to cell level. In particular, cell history may be monitored by taking advantage of ACU 30 data on voltage/current and cell temperature as a function of time. From these data, energy (integrated over time), discharge curves in operation and actual battery capacity may be inferred. By defining references/thresholds for the battery discharge and the energy content of battery cells 20 and by comparing these with the data furnished by ACU 30, actual performance status of any given battery cell may be assessed. In particular, degraded and underperforming battery cells may be identified (block 360 in method 300). Once a given cell has been identified as defective, it may be removed from the battery module 10 using switch 35 (block 370). In addition (or instead), a warning may be issued (block 380) to the vehicle operating system and or to a battery charger system (block 370). Also, removed (defective) cells may be replaced by spare cells if these are available in the battery network.

Figure 2B:
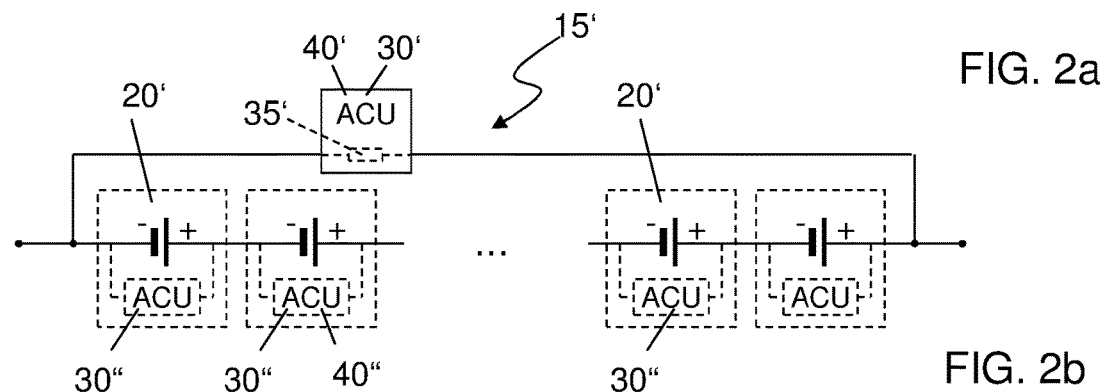
FIG. 2b is a schematic circuit diagram of a plurality of battery cells arranged in a serial array, the serial array being equipped with a shared ACU.

While in the embodiment of FIG. 2a each battery cell 20 is assigned its own dedicated ACU 30, a second embodiment of the invention, shown in FIG. 2b, has a dedicated analysis/control units (ACU) 30' is assigned to each string 15' of several battery cells 20'. In this embodiment, the respective ACU chip 40' manages analysis, control and monitoring of the entire string 15' of battery cells 20. ACU chip 40' furnishes data on the relevant parameters of the whole string 15' and comprises a switch 35' for electrically disconnecting the whole string 15' from the remaining battery cells of battery module 10. While FIG. 2b shows an embodiment of an ACU chip 40' managing a string 15' of battery cells, the underlying principle of managing multiple electrically connected cells 20' with a single ACU chip 40' may be generally applied to a set of serialized and/or parallel cells 20' forming cell blocks 15, 15'. A cell block monitoring arrangement of the type of FIG. 2b (in contrast to the single cell monitoring arrangement of FIG. 2a) does not permit analysis and control down to individual cell level, but it is more cost effective since it requires less ACUs 30' for analyzing/controlling a given battery module 10.

Note that various combinations of single cell management of FIG. 2a and the cell block management of FIG. 2b are possible. For example, block management of FIG. 2b can be enhanced by attaching an ACU chip 40" to each individual battery cell 20' (illustrated by dotted lines in FIG. 2b), where ACU chips 40" have only monitoring capability whereas ACU chip 40' has both monitoring and control capability. ACU chips 40" enable analysis and monitoring capability on single cell level (i.e., with a very high granularity), whereas ACU chip 40' executes control on string level (via switch 35') and enables additional data transparency and availability, for example, when analyzing history data taken in operational mode as well as in charge mode of battery module 10.

Battery module 10 may contain spare blocks 15" (see FIG. 1) which are switched off during proper operation of the battery 10. This is especially useful if battery 10 is to be used in an electric drive system. If control system 60 detects failing battery cells 20, the corresponding block 15 can be switched off and a spare block can be added in order to maintain adequate performance level of battery module 10. This increases reliability and comfort. Moreover, spare blocks may be used for range extension in case of urgent need. Note that in the embodiment of FIG. 2a, this capability can be applied down to cell level.

Using battery management system 100, cell 20 and/or block 15 performance may be monitored during operation. Based on these data, the cells/blocks best suited for a given operational state may be determined and linked to the battery module 10 for optimized performance. This decision may be taken in a precautionary way, for example, in view of aging characteristics of individual cells/blocks. More generally, management system 100 may be used for managing and improving maintenance cycles down to cell/block level, since ACUs 30 yield information for real time notification and service guidance.

If the battery module 10 is used as part of an electrical drive system of a vehicle, the discharge curves in operation (voltage and current) may be correlated to driven distance and speed. The actual battery capacity (i.e. the remaining charge) may be evaluated in order to give the driver an estimate of the cruising range and to provide the driver with feedback on how to optimize driving performance for achieving maximum battery network availability. Moreover, the data collected by battery management system 100 may be loaded into the vehicle CPU 70 for further evaluation and/or may be transferred to a charge station CPU 70 during battery charging and/or via the WEB (see FIG. 1). In the charge station, the charge curve of individual cells/blocks may be monitored as a function of time. A count of the number and frequency of charge cycles yields information on the usage of this individual cell 20. Communication of battery controller 60 to vehicle and/or charge station CPU 70 may furthermore implement deep discharge protection and overcharge protection as well as emergency reporting and life time reporting.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for performance analysis and use management of a battery module, wherein the battery module comprises a multitude of interconnected battery cells and a battery management system with a plurality of dedicated analysis/control units (ACUs) that analyze performance of the battery module, the ACUs being assigned to individual battery cells and the ACUs being assigned to battery blocks of the battery module, the method comprising:
measuring current and voltage of one or more of an individual battery cell and a battery block;
calculating a charge removal from the one or more of the individual battery cell and the battery block;
calculating a charge of the one or more of the individual battery cell and the battery block;
determining the remaining charge of the one or more of the individual battery cell and the battery block;
performing failure monitoring of the one or more of the individual battery cell and the battery block; and
transmitting a signal identifying the ACU of the battery block and the battery cell, wherein the signal identifying the ACU of the battery block and the battery cell is an encoded signal transmitted over a powerline communication channel wherein the ACU chip is attached in proximity to a power pin of an associated one or more of the individual battery cell and the battery block, wherein the ACU chip at least partly encloses the power pin of the associated one or more of the individual battery cell and the battery block.

2. The method according to claim 1, wherein the voltage measurement is performed through power contacts of the one or more of the individual battery cell and the battery block.

3. The method according to claim 1, wherein the current measurement is performed using a Hall effect probe located in proximity of one of the power contacts of the one or more of the individual battery cell and the battery block.

4. The method according to claim 1, wherein the failure monitoring of the one or more of the individual battery cell and the battery block comprises issuing a warning if the one or more of the individual battery cell and the battery block is found to have reached a predefined level of degradation.

5. The method according to claim 4, wherein the warning is issued to one of a vehicle control unit and a charger control unit.

6. The method according to claim 1, wherein the failure monitoring of the one or more of the individual battery cell and the battery block comprises switching of the one or more of the individual battery cell and the battery block if the one or more of the individual battery cell and the battery block is found to have reached a predefined level of degradation.

7. The method according to claim 6, wherein the failure monitoring of the one or more of the individual battery cell and the battery block comprises adding one or more of a spare battery cell and a spare battery block as a replacement for the degraded one or more of the individual battery cell and the battery block.

8. A battery module, comprising:
a plurality of interconnected battery cells and a battery management system with a plurality of dedicated analysis/control units (ACUs) comprising ACU chips that analyze performance of one or more of an individual battery cell and the ACUs being assigned to a battery block, wherein each ACU chip comprises:
at least one sensor configured to measure voltage and one sensor configured to measure current of an associated one or more of the individual battery cell and the battery block; and
a switch configured to remove the one or more of the individual battery cell and the battery block from the battery module network if the one or more of the individual battery cell and the battery block is found to have reached a predefined level of degradation, wherein the ACU is configured to transmit a signal identifying the ACU of the battery block and the battery cell, wherein the signal identifying the ACU of the battery block and the battery cell is an encoded signal transmitted over a powerline communication channel,
wherein the ACU chip is attached in proximity to a power pin of an associated one or more of the individual battery cell and the battery block, wherein the ACU chip at least partly encloses the power pin of the associated one or more of the individual battery cell and the battery block.

9. The battery module according to claim 8, wherein the battery module comprises one or more of spare battery cells and battery blocks for replacement of a degraded one or more of the individual battery cell and the battery block.

10. The battery module according to claim 8, wherein for a battery cell in serial arrangement with other battery cells, the ACU chip is connected in parallel arrangement to the battery cell.

11. The battery module according to claim 8, wherein the ACU chip further comprises a thermal sensor configured to monitor the temperature of an associated one or more of the individual battery cell and the battery block.

12. The battery module according to claim 8, wherein the ACU chip comprises a transmission circuit for configured to transfer signals issued from sensors to a collector unit of the battery module.

13. The battery module according to claim 12, wherein the ACU chip comprises an RF unit configured to enable wireless communication between a control unit chip of a solar cell and a collector unit of a photovoltaic module.

14. The battery module according to claim 8, wherein the ACU chip comprises a switch configured to short-circuit a selected one or more of the individual battery cell and the battery block.

15. A non-transitory, computer readable medium having computer readable instructions stored thereon that, when executed by a computer, implement a method for performance analysis and use management of a battery module, wherein the battery module comprises a multitude of interconnected battery cells and a battery management system with a plurality of dedicated analysis/control units (ACUs) that analyze performance of the battery module, the ACUs being assigned to individual battery cells and the ACUs being assigned to battery blocks of the battery module, wherein the method comprises:

measuring current and voltage of one or more of an individual battery cell and a battery block;

calculating a charge removal from the one or more of the individual battery cell and the battery block;

calculating a charge of the one or more of the individual battery cell and the battery block;

determining the remaining charge of the one or more of the individual battery cell and the battery block;

performing failure monitoring of the one or more of the individual battery cell and the battery block; and transmitting a signal identifying the ACU of the battery block and the battery cell, wherein the signal identifying the ACU of the battery block and the battery cell is an encoded signal transmitted over a powerline communication channel wherein the ACU chip is attached in proximity to a power pin of an associated one or more of the individual battery cell and the battery block, wherein the ACU chip at least partly encloses the power pin of the associated one or more of the individual battery cell and the battery block.

16. The computer readable medium according to claim 15, wherein the voltage measurement is performed through power contacts of the one or more of the individual battery cell and the battery block.

17. The computer readable medium according to claim 15, wherein the current measurement is performed using a Hall effect probe located in proximity of one of the power contacts of the one or more of the individual battery cell and the battery block.

18. The computer readable medium according to claim 15, wherein the failure monitoring of the one or more of the individual battery cell and the battery block comprises issuing a warning if the one or more of the individual battery cell and the battery block is found to have reached a predefined level of degradation.

19. The computer readable medium according to claim 18, wherein the warning is issued to one of a vehicle control unit and a charger control unit.

\* \* \* \* \*